(12) United States Patent
Ochoa et al.

(10) Patent No.: US 9,382,022 B2
(45) Date of Patent: Jul. 5, 2016

(54) PACKING INSERT FOR DISC-SHAPED OBJECTS

(71) Applicant: TEXAS INSTRUMENTS INCORPORATED, Dallas, TX (US)

(72) Inventors: Rolando Ochoa, Rowlett, TX (US); Ismael Tamez, Jr., Rockwall, TX (US); Albert Winston D. Escusa, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 133 days.

(21) Appl. No.: 13/796,962

(22) Filed: Mar. 12, 2013

(65) Prior Publication Data
US 2014/0033659 A1 Feb. 6, 2014

Related U.S. Application Data

(62) Division of application No. 12/105,463, filed on Apr. 18, 2008, now Pat. No. 8,393,471.

(51) Int. Cl.
*B65D 85/30* (2006.01)
*B65B 5/08* (2006.01)
*H01L 21/673* (2006.01)

(52) U.S. Cl.
CPC .............. *B65B 5/08* (2013.01); *H01L 21/67369* (2013.01); *H01L 21/67386* (2013.01)

(58) Field of Classification Search
CPC .................. H01L 21/67369; H01L 21/67386; B65B 5/08
USPC .............. 206/308.1, 701, 449, 710, 454, 593, 206/832, 521, 594; 53/476, 486, 487
See application file for complete search history.

(56) References Cited

U.S. PATENT DOCUMENTS 3,392,824 A * 7/1968 Flynn .............................. 206/594
3,552,548 A * 1/1971 Wallestad et al. ............. 206/710

(Continued)

OTHER PUBLICATIONS

Wikipedia, the free encyclopedia, "Cantilever", http://en.wikipedia.org/wiki/Cantilever, Oct. 25, 2012, pp. 1-6.

(Continued)

*Primary Examiner* — Chun Cheung
(74) *Attorney, Agent, or Firm* — Daniel Chan; Frank D. Cimino (57) ABSTRACT

A packing insert for disc-shaped objects comprising a ring and a deformable contacting portion supported by the ring and extending from a circumference of the ring. The contacting portion can comprise one or more solid portions extending from the circumference. The solid portions can define a plurality of radially arranged members separated by a plurality of void regions, where the solid portions extending radially from a circumference of the ring.

16 Claims, 5 Drawing Sheets

(56) References Cited

U.S. PATENT DOCUMENTS

| | | |
|---|---|---|
| 3,661,253 A | 5/1972 | Cronkhite |
| 4,114,761 A | 9/1978 | Kleiner |
| 5,366,079 A | 11/1994 | Lin et al. |
| 6,119,865 A | 9/2000 | Kawada |
| 6,193,068 B1 | 2/2001 | Lewis et al. |
| 6,550,619 B2 | 4/2003 | Bores et al. |
| 6,644,218 B2* | 11/2003 | Gruber ................. 108/57.12 |
| 6,848,579 B2* | 2/2005 | Cleaver ................. 206/454 |
| 6,926,150 B2 | 8/2005 | Amador et al. |
| 7,322,471 B2 | 1/2008 | Cleaver |
| 7,510,082 B2 | 3/2009 | Kimura et al. |
| 7,578,392 B2* | 8/2009 | Brooks et al. ................. 206/710 |
| 2005/0133403 A1* | 6/2005 | Cleaver ................. 206/723 |
| 2007/0068846 A1* | 3/2007 | Hsiao ................. H01L 21/67383 206/710 |
| 2011/0180451 A1* | 7/2011 | Pylant et al. ................. 206/592 |

OTHER PUBLICATIONS

Dictionary.com, "cantilevered", Oct. 25, 2012, p. 2.

* cited by examiner

PACKING INSERT FOR DISC-SHAPED OBJECTS

This application is a divisional of U.S. patent application Ser. No. 12/105,463 (now U.S. Pat. No. 8,393,471, granted Mar. 13, 2013) and entitled "PACKING INSERT FOR DISC-SHAPED OBJECTS," and filed on Apr. 18, 2008, which is incorporated by reference herein for all purposes.

FIELD OF THE INVENTION

The present invention is related to the field of packing disc-shaped objects and more particularly, to inserts for packing disc-shaped objects.

BACKGROUND

Typically, integrated circuits are manufactured from semiconductor wafers that are conventionally round in shape and made of thin, brittle substrates. Additionally, wafers may be lapped, resulting in further thinning of the wafers. Traditionally, during the processing, storage, and shipping of semiconductor wafers the wafers are supported and constrained at their edges to prevent any contact and possible damage and contamination to the faces of the wafers having the circuits thereon. The trend towards larger, more dense and thinner wafers, has resulted in the wafers becoming more valuable, more brittle, more easily damaged during shipment. Although it is possible to ship thicker wafers in enclosed containers that would support the wafers exclusively by their edges, using such devices to ship these thinner wafers has proven problematic due to breakage and damage of the wafers. Thus for these more fragile wafers, containers are utilized in which the wafers are stacked on top of one another and separated by layers of paper-like flexible sheet material or rigid support rings. In these "horizontal" wafer containers, each wafer is typically supported by adjacent wafers. Furthermore, foam materials, such as urethane and closed-cell polyethylene, are commonly used to cushion the top and bottom of the stack.

Horizontal wafer containers for shipping stacks of wafers are typically designed for shipment of a fixed number of wafers. As a result, when it is necessary to ship less wafers than the container was designed for, the container is typically filled with additional inserts to fill the volume of the container and to secure the reduced number of wafers. However, this type of packing methodology can increase the usage rate of packing materials and thus the costs for packing the wafers. Furthermore, the resulting packing procedure is typically inefficient as a longer amount of time is necessary to determine and stack the needed number of inserts into the container. In addition, such inserts may move during shipping and cause wafer damage.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

In a first embodiment of the invention, A packing insert for disc-shaped objects is provided. The packing insert can comprise a ring and a deformable contacting portion supported by the ring and extending from a circumference of the ring. The contacting portion can comprise one or more solid portions extending from the circumference, where the solid portions defining a plurality of radially arranged members separated by plurality of void regions. The solid portions can extend radially from the circumference.

In a second embodiment of the invention, a containment system for disc-shaped objects is provided. The system can comprise a container having a cover and a base, the base having at least one support portion for receiving a stack of disc-shaped objects, and the support portion defining a container height, the cover removably attachable to the base. The system can also comprise at least one compressible packing insert for the support portion having a variable height between a pre-defined filler height and at least the container height. The insert can comprise a ring and a deformable contacting portion supported by the ring and extending from a circumference of the ring. The contacting portion can comprise one or more solid portions extending from the circumference, where the solid portions define a plurality of radially arranged members separated by plurality of void regions and can extend radially from the circumference.

In a third embodiment of the invention, a method for packing disc-shaped objects is provided. The method can comprise providing a container base for receiving one or more disc-shaped objects, the base having at least one support portion for retaining a stack of disc-shaped objects, and the support portion defining a container height. The method can also include placing at least one disc-shaped object into the support portion, where the remaining space in the support portion defines a filler height. The method can further include inserting the a compressible packing insert into the support portion, the packing insert comprising a ring and a deformable contacting portion supported by the ring and extending from a circumference of the ring. The contacting portion can comprise one or more solid portions extending from the circumference and the solid portions can define a plurality of radially arranged members separated by plurality of void regions, where the solid portions extending radially the circumference.

DETAILED DESCRIPTION OF THE INVENTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the present invention provide systems and methods for packing disc-shaped objects in a stacked or horizontal configuration. Although the various embodiments of the present invention will be illustrated in terms of packing inserts and containers for semiconductor wafers, one of ordinary skill in the art will recognize that the present invention can be used for the packing of any type of disc-shaped objects. The term "disc-shaped", as used herein, refers to any flattened and primarily circular-shaped object. That is, disc-shaped objects are not limited to only solid flat circular objects, but can also include primarily circular-shaped objects having one or more openings, such as rings or perforated objects provided in a primarily circular shape. Additionally, the perimeter of disc-shaped objects need not have a perfectly circular perimeter. For example, disc-shaped objects can include semiconductor wafers with a wafer flat or orientation notches. In another example, a primarily circular object can have any type or regular or irregular pattern along its edge. Furthermore, the disc-shaped objects need not be perfectly flat. That is, the objects need only be flattened such that they are capable of being stacked vertically. For example, disc-shaped objects can include any number of objects having one or more convex and/or concave surface portions.

As previously described, one of the main inefficiencies in the packing of disc-shaped objects is the need to provide additional insert materials when packing a container for disc-shaped objects with less objects than the container was designed for. Therefore, one aspect of the present invention is to provide a single packing insert that can be used to fill a container for stacking disc-shaped objects in lieu of multiple conventional inserts. Furthermore, to provide a single packing insert for each container, another aspect of the present invention is that the packing insert can be used with varying numbers of disc-shaped objects in the container.

Therefore, the various embodiments of the present invention provide an elastically deformable packing insert for use with a container. The elastically deformable packing insert can be configured such that upon closing of the container using a cover or a lid, the force applied by closing of the lid causes the packing insert to deform and conform to the space remaining within the container. However, the inventors note that to safely transport objects, the packing insert needs not only to conform to the empty space within the container, but also needs to stabilize the objects store therein. Therefore, another aspect of the present invention provides that the deformable packing insert, upon closing of the container lid, exerts force on the disc-shaped objects in the container and an interior surface of a container in a manner that prevents motion of the objects during shipment. Accordingly, the inventors have discovered that a packing insert needs not only to be elastically deformable but should provide force over a sufficient area of the disc-shaped objects and a interior surface of the container during shipment to prevent slippage of the packing insert, the disc-shaped objects, or both.

A force can be provided evenly to a disc-shaped object by applying the force evenly over the edge of the disc-shaped object and a portion of a facing inner surface of a container. An edge-based configuration can also reduce potential damage to the disc-shaped objects by limiting the amount of contact between the packing insert and the object. This can be critical when the disc-shaped objects are sensitive to damage, as in the case of semiconductor wafers. In contrast, the force provided over the interior surface of the container can be provided in several ways since contacting the interior surface of the container is not damage inducing. The inventors have found that as the area over which force is applied to the interior surface of the container being contacted is increased, the more stable and even the force applied to the disc-shaped objects becomes.

Figure 1:
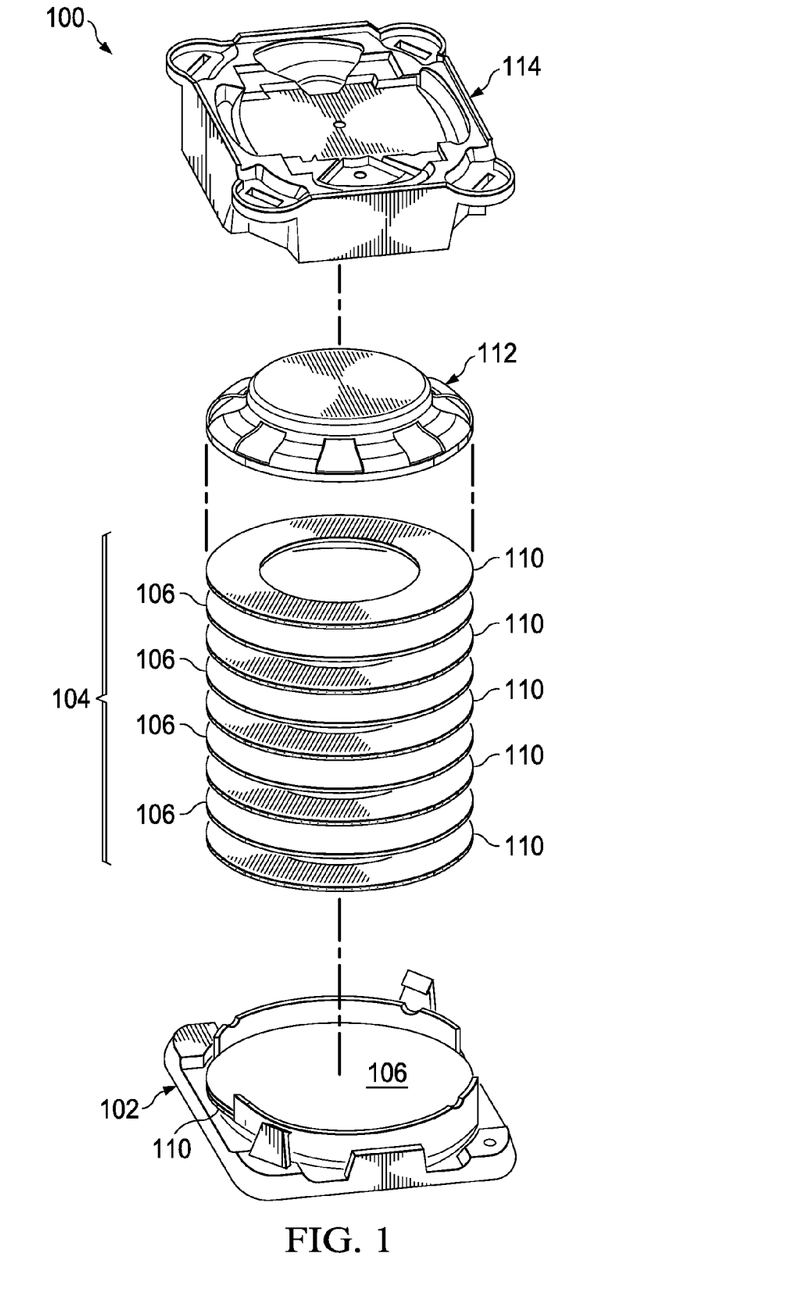
FIG. 1 shows an exploded view of components for packing disc-shaped objects according to the various embodiments of the present invention.

An exemplary arrangement for a packing disc-shaped objects according to an embodiment of the present invention is shown in FIG. 1. In FIG. 1, a container base 102 can be provided for receiving the disc-shaped objects. The container base 102 can be configured to have one or more support structures 103 for retaining one or more disc-shaped objects 104 of a specific size. The container base 102 can be a bottom portion of a semiconductor wafer shipment box, where the support structures are configured for retaining a stack of wafers of a particular diameter, as shown in FIG. 1. Disc-shaped objects 104 can include not only the disc-shaped products 106 to be shipped, but can also include any disc-shaped cushioning objects 108 and disc-shaped separator objects 110 used for packing the disc-shaped products 106. Disc-shaped separating objects 110 can include, by way of example and not by way of limitation, additional rigid or flexible disc-shaped cushioning and separating inserts. The type, number, and arrangement of the disc-shaped separating objects 110 can vary according to the type, number, and arrangement of disc-shaped products 106 to be shipped. Once the disc-shaped objects 104 are inserted into the base 102, a packing insert 112 can be inserted into the base 102 and a container cover 114 can be attached to the base to enclose the disc-shaped objects 104 and the packing insert 112.

Figure 2A:
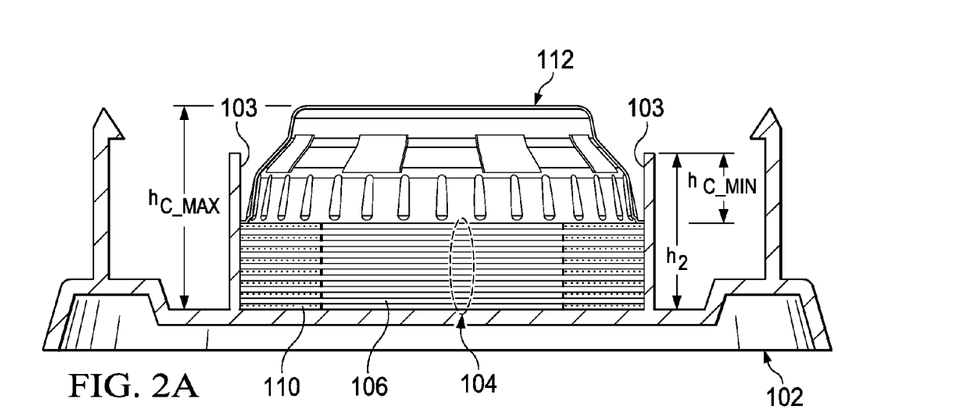
FIG. 2A shows an exemplary arrangement of a packing insert in a container with disc-shaped objects prior to placement of a container cover according to an embodiment of the present invention.
Figure 2B:
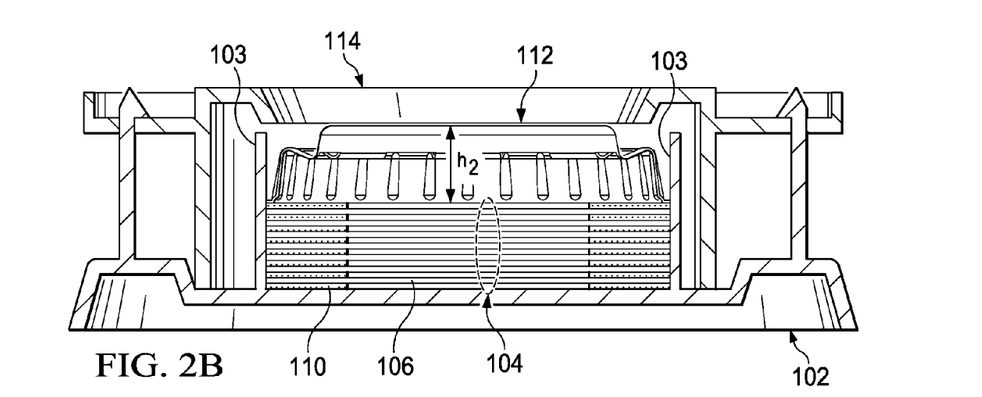
FIG. 2B shows the result of placement of the container cover in the arrangement in FIG. 2A.

As previously described, the placement of the cover 114 results in deformation of the packing insert 112. This is conceptually illustrated in FIGS. 2A and 2B. FIG. 2A shows the result of placing a packing insert 112 and one or more disc-shaped objects 104 in a base 102, as previously described in FIG. 1. FIG. 2B shows the result of placing and securing a contained cover 114 on the base 102. As previously described, the placement of the cover 114, results in deformation of the packing insert 112. Principally, the deformation results in a reduction of the height of the packing insert 112 from an uncompressed height $h_1$, as shown in FIG. 2A, to a compressed height $h_2$, as shown in FIG. 2A.

In the various embodiments of the present invention, insert 112 can be configured to have an uncompressed height $h_1$ that provides at least a minimum amount of securing force onto a disc-shaped object 104, when only a single disc-shaped object 104 is included placed into the base 102. That is, if only one disc-shaped object 104 is placed in the base 102, some minimum amount of deformation of the insert 112 results upon placement of the cover 114. This can be accomplished by configuring the insert 112 to have a height $h_1$ greater than the maximum filled container height $h_{C,MAX}$, as shown in FIG. 2A. That is, the total amount of space left in the base 102 after packing a single shipped disc-shaped object 108. One of ordinary skill in the art will recognize that this amount can vary depending on the minimum amount of packing material required. For example, although a cushion object 108 is shown in FIGS. 2A and 2B, no cushion objects 108 or separating objects 110 may be needed for packing a single disc-shaped object 106 of a particular type. Therefore the minimum fill container height $h_{C,MAX}$ can be almost, if not equal to, the container height $h_C$ (i.e. total amount of space for disc-shaped objects 104 in the base 102). Additionally, the insert 112 can also be configured to have at least a minimum compressed height $h_2$. That is, when the base 102 is filled to capacity, the insert 112 should be compressible to a height of the remaining space. This can be accomplished by allowing the insert to compressed to at least a height $h_2$ that is equal to the minimum filled container height $h_{C,MIN}$. That is, the total amount of space left in the base 102 after inserting the maximum allowed number of shipped disc-shaped objects 110 into the base. One of ordinary skill in the art will recognize that this amount can vary depending on the minimum amount of packing material required, as previously described.

Figure 3A:
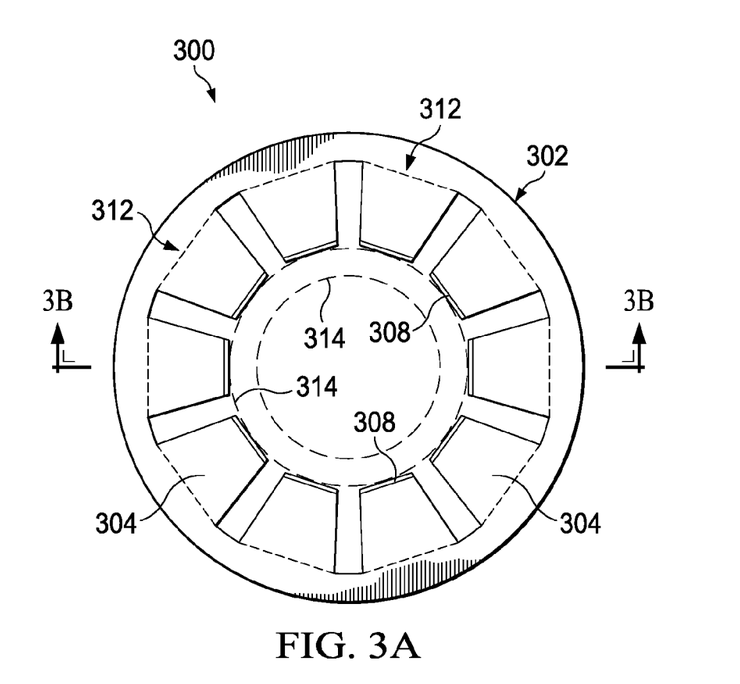
FIGS. 3A and 3B show top and cross-sectional views of a package insert according to one embodiment of the present invention.
Figure 3B:
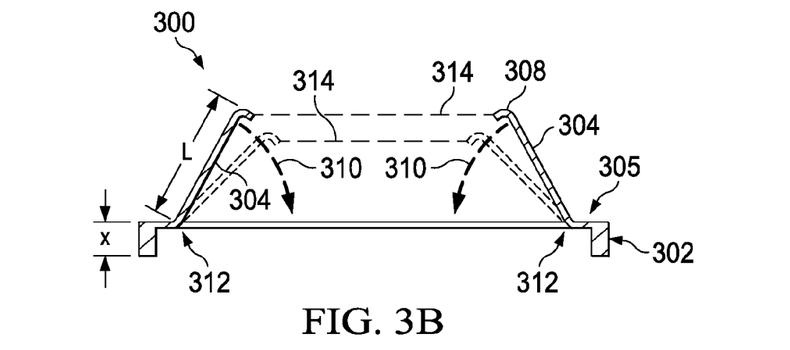

FIGS. 3A and 3B show a first embodiment of a packing insert 300 for packing disc-shaped objects. As shown in the figures, insert 300 comprises a ring 302 and a plurality of members 304 supported by and extending radially from a circumference of the ring 302. A "circumference", as used herein, refers to a circular path along the surface of the ring during a revolution of the ring. Extending "radially", as used herein, refers to extending in a direction having a direction component in the plane defined by the ring, where the component extends in a direction from the circumference to the center of the ring. That is, the projection onto the plane. The members 304 can have far or distal ends 308 of the members 304 that not only can extend radially from the ring 302, but that can have a common vertical component. For example, that the members 304 can extend vertically in the same direction with respect to the ring 302, as shown in FIG. 3B. Additionally, the members can extend from a single solid portion 305 extending from the ring 302, as shown in FIG. 3B.

In the embodiment shown in FIG. 3B, the distal ends 308 are shown to have some amount of curvature. Such a configuration can be used to provide a smooth bearing surface between the insert 300 and a contacted interior surface of a container when the insert 300 is being compressed and the members 304 are being deflected.

In the various embodiments of the present invention, the insert 300 can be formed such that the members 304 can deform when pressure is applied to them. For example, as shown in FIG. 3B, the members 304 can be configured to elastically deflect in a direction 310. That is, the members 304 can be constructed to essentially form cantilever springs that exert force in a direction opposite to the direction of deflection 310. Accordingly, once force is no longer applied, the members 302 can return to their non-deflected configuration. Additionally, even though the members 304 can be configured to deflect by bending any portion thereof in response to a force applied to them, in some embodiments of the present invention, the members 304 can be configured to bend at a specific location. For example, seams 312 can be used to designate the pivot point for the member 304. In the case of an insert 300 constructed from a single type of material, a seam 312 can be formed by reducing the thickness of the material at specific locations in the insert. For example, a seam 312 can have a thickness that is 20% less than that of the remaining portion of the members 304 or other portions of the insert 300. These seams 312 can result in more flexible portions of the members 304 that allow the members to at least initially deform in a preferred direction.

As previously, described, one aspect of the present invention is to provide a packing insert that stabilizes the disc-shaped objects within a container. That is, the packing insert and/or the disc-shaped object are designed to not slip during shipment. Accordingly, the inventors have discovered that by providing a packing insert that distributes force over a sufficiently large area on both sides of the packing insert, the possibility of the packing insert slipping or dislocating during shipment is reduced or eliminated. Thus, in the various embodiments of the present invention, the positions of the distal ends 308 can define a contacting region 314. Normally, the size of the contacting region 314 can vary as the members 304 deflect in a direction 310, resulting in an increased probability of slippage. However, in the various embodiments of the present invention, the minimum size of the contacting region 314 can be limited to prevent loss of stability. In the various embodiments, the size and configuration of the minimum contacting region area 314, can be configured such that the area of the contacting region 314, whether compressed or uncompressed is between 5% and 65% of the area defined by the ring 302. However, the inventors have found that although the area can be reduced below 5% without generally causing damage during shipment, an area of at least 15% after compression results is additional stability or support.

Because the range of resulting areas can vary, the members 304 can be configured to have any length and angle that results in the desired area. For example, to provide contact region areas that are between 5% and 65% of the area defined by the ring, the members 304 can radially extend between 20% and 80% of the distance to the center of the ring. That is, even if the members 304 extend at an angle, the projected component in the plane of the ring will be 20% to 80% of the distance to the center of the ring. However, the members 304 can extend only vertically (with a projected component length equal to zero) or can extend completely to the center of the ring (with a projected component length=100% of the distance to the center of the ring). In one example, if the packing insert in FIG. 3B is configured for packing 200 mm semiconductor wafers, by using a member length L ~52 mm and projecting the member 304 at a approximately 66 degrees, an uncompressed contact area that is ~30% of the area defined by the ring 302. As the members 304 are deflected, the resulting area will not fall below 20%, ensuring stability. One of ordinary skill in the art will recognize that in the various embodiments, the length and angle of the members 304, relative to the ring, can vary according to the desired compressed and uncompressed contact areas required. However, one of ordinary skill in the art will recognize that as the length of the members 304 increases, the amount of compression will be reduced.

In some embodiments, the compressed contact area can be limited by limiting the amount of deflection of the member 304. For example, increasing the stiffness of the members 304 can limit the amount of deflection of the member 304s. However, in such embodiments, the number of disc-shaped object that can be stored in a container is limited as the compressed height of the packing insert is increased.

In addition to stabilizing the disc-shaped objects within the container, potential damage from the packing insert can also be limited. That is, in the case of disc-shaped objects that can be easily damaged, the amount of contact between the packing insert and the disc-shaped objects can be limited. First, as previously described, only the ring portion is generally placed in contact with the disc-shaped object. Second, as shown in FIG. 3B, even though the members 304 can potentially fold flat and contact a disc-shaped object below, the ring 302 can have an increased thickness or height (X) so that if even when fully deflected, the portion of the members 304 overlapping the height of rings 302 is less than the ring height (X). Accordingly, in this embodiment only the edges of the disc-shaped objects come into contact with the insert 300, and only via the ring 302.

In some embodiments, the stiffness of the members 304 can also be adjusted to account for the types of disc-shaped objects being shipped. For example, in the case of semiconductor wafers, the stiffness can be limited to prevent the packing insert from placing too much force on the wafers and resulting in breakage. However, in the case of less fragile objects, packing inserts with greater force can be used.

In the various embodiments, the number of members can vary. However, the inventors have discovered that as the number of members is reduced, the force of lid of a contact is distributed less evenly over the surface of the disc-shaped objects. In the case of more fragile disc-shaped objects, this can result in breakage during shipments. Accordingly, the inventors have discovered that while any number of members can be used, using 8 members or more, consistently provides force evenly over the surface of disc-shaped objects when the packing insert is compressed, resulting in fewer damaged objects.

Figure 4A:
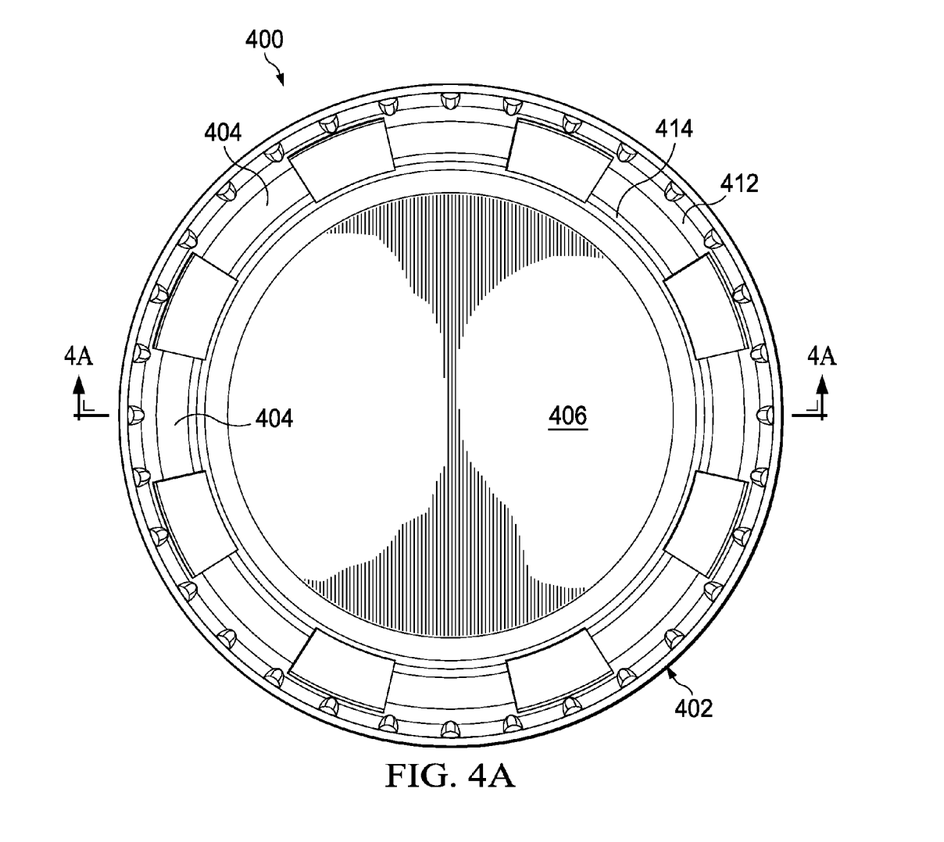
FIGS. 4A and 4B show top and cross-sectional views of a package insert according to another embodiment of the present invention in an uncompressed state.
Figure 4B:
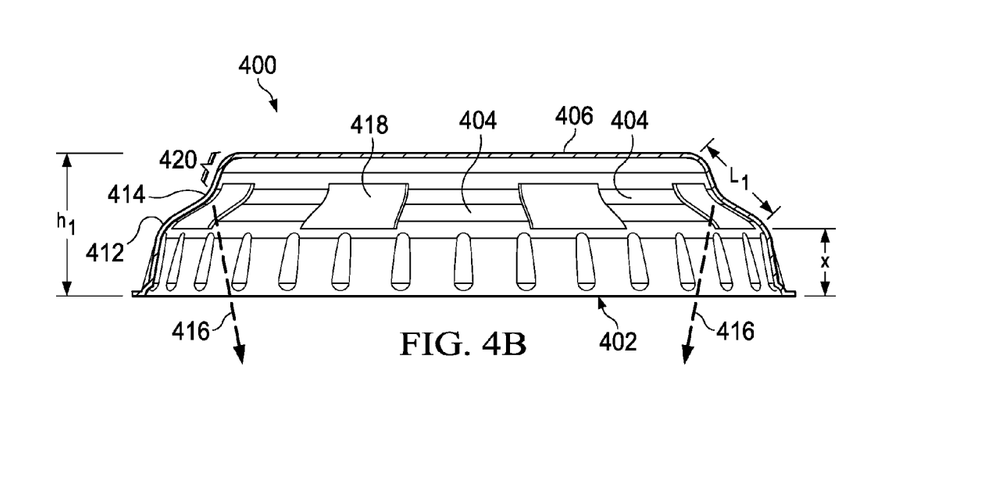

However, the invention is not limited to providing a contacting area using only the distal ends of members extending from a ring. In some embodiments of the present invention, a fixed size contacting surface can also be provided. For example, as shown in FIGS. 4A and 4B, a packing insert 400 can include a ring 402, a plurality of members 404, and a contacting surface 406. For insert 400, the members 404 can be used to radially support the contacting surface 406. By providing a contacting surface 406, the area being contacted on both sides can be constant, as opposed to the varying area of the contacting region 314 in FIGS. 3A and 3B. Thus, the constant area of the contact surface 406 ensures that force is provided over a minimum area to ensure the insert 400 provides sufficient stability to disc-shaped objects in a container. The area, as previously described, can be fixed between 5% and 65% of the area defined by the ring. For insert 400, the members 404 can also be configured to deform elastically. In such embodiments, the members 404 can be configured to operate essentially as springs. That is, each of the members 404 can be configured to have one or more curved or bent portions between the ring 402 and the contact surface 406. Accordingly, when a force is exerted on the contacting surface 406, the members 404 are elastically compressed.

Figure 4C:
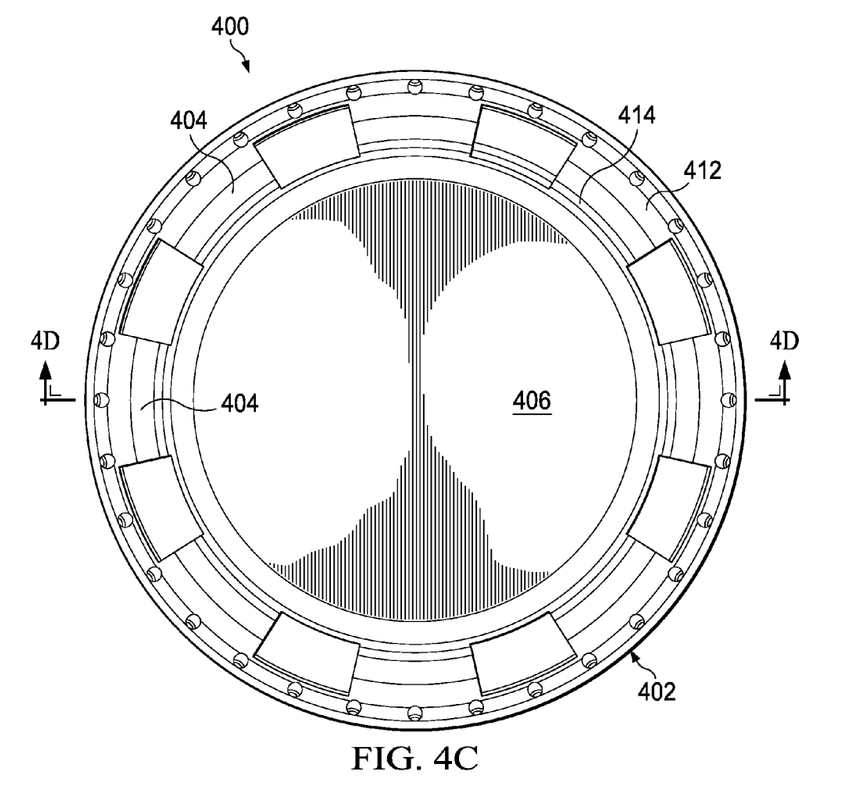
FIGS. 4C and 4D show perspective and cross-sectional views of the package insert in FIG. 4A in an compressed state.
Figure 4D:
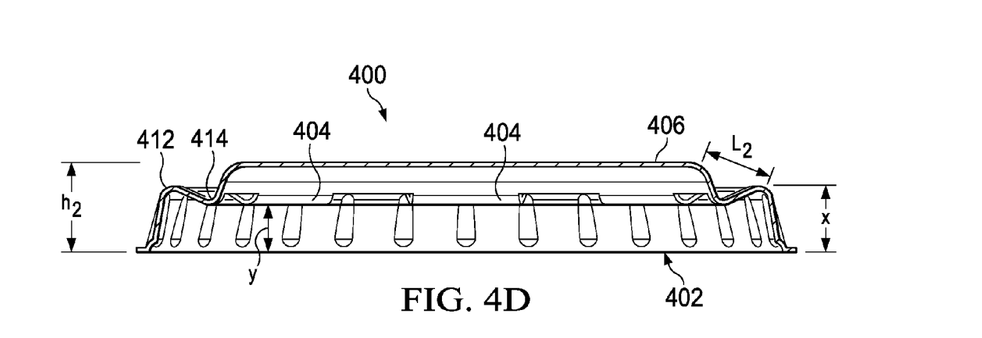

In some embodiments, how the members 404 compress can be further defined using seams 412 and 414, which can be formed via thickness reduction as previously described for insert 300. However, seams 412 and 414 can also be naturally formed by bends or points in the members 404 associated with a change in direction. For example, the curvature of the members 404 result in seams 412 and 414 without thinning Regardless of how the seams 412, 414 are formed, in response to a force exerted on the contacting surface 406, the members 404 are compressed along the seams 412, 414. The result of compressing insert 400 is shown in FIGS. 4C and 4D. In the compressed configuration, the length of the member is reduced by the compression (L2<L1). This also can result in energy being stored in the compressed member 404. Therefore, once force is no longer applied to the contacting insert, the stored energy in the compressed members 404 can return the insert 400 to its non-deformed configuration.

As shown in FIGS. 4B and 4D, the compression of members 404 can result in at least a portion of the members 404 moving in a direction 416. Unchecked, the portion of the members 404 moving could eventually contact the surface of a disc-shaped object below the insert 400. As previously described, the amount of contact between a packing insert and the disc-shaped objects can be limited. For example, as shown in FIG. 4D, the ring 402 can have an increased thickness or height (X) so that if even when members 404 are fully compressed, the portion of the members 404 and the rings 402 overlapping is still less than the ring height (X).

In some embodiments, further stability can be provided for the contacting surface 406 by incorporating an upper support ring into the contacting surface. For example, as shown in FIG. 4B, the void regions 418 can be limited such that an edge of the void regions does not coincide with the contacting surface. In such embodiments, the result is an upper support ring 420 around the periphery of the contacting surface 406. This support ring provides additional stiffness to the contact area 406, resulting in a reduced possibility of compression of the packing insert 400 due to warping of the contacting surface 406 under pressure, rather than compression of the members 404.

However, the present invention is not limited to deforming the packing insert based solely on compression or deflection of members extending from a ring. In some embodiments, the contacting surface 406 can also deform under an applied force. For example, as shown in FIG. 4B, in embodiments without the upper support ring 420 (i.e., the edges of the voids 418 coincide with the contacting surface 406) and with a sufficient number of members (at least 8) or member stiffness, pressure on the contacting surface can cause the contacting surface 406 and adjacent portions of the members 404 to deform prior to significant deformation of the members 404 or deformation along any seams 412, 414.

Although various types of materials can be used for constructing the packing insert, the selected materials can depend on type of disc-shaped objects being used. For example, in the case of semiconductor wafers electrically and chemically inactive materials can be used, such as polymers including polypropylene and PFA, can be used. However, the amount of force needed for the deformation of the package inserts 300, 400, and 500 can be vary based on the materials used. Thus, as the necessary securing force varies or the strength of the disc-shaped objects varies, different materials can be selected. For example, if greater force is needed to secure and stabilize disc-shaped objects being shipped, materials can be selected having a greater stiffness. Accordingly, the amount of force needed to deform the packing inserts and the amount of force exerted by the packing inserts on the disc-shaped objects is increased. In contrast, for more brittle objects, a lesser amount of force can be required.

In cases where the packing inserts are integrally formed, stiffness can be varied by adjusting the cross-sectional area of the various portions of the inserts. For example, in insert 400, the cross-sectional thickness of the contacting surface 406 and the members 404 can be adjusted separately to adjust of the stiffness of each component. Accordingly the total amount of deformation can also be adjusted as needed. Additionally, the cross-sectional area of the ring portions of inserts 300 and 400 can also be adjusted to determine the amount of force per unit area applied to the disc-shaped objects. For example, for more brittle objects, the force may be distributed over a relatively larger area by increasing a cross-sectional area of the ring portion of inserts 300 and 400.

While various embodiments of the present invention have been described above, it should be understood that they have been presented by way of example only, and not limitation. Numerous changes to the disclosed embodiments can be made in accordance with the disclosure herein without departing from the spirit or scope of the invention.

These are but a few examples. Accordingly, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. A method for packing an integrated circuit on a wafer disc, the method comprising:
   receiving the wafer disc into a container base;
   placing a separator disc on the wafer disc to contact only a circumferential edge of the wafer disc;
   placing a compressible insert on the separator disc, the compressible insert comprising a ring and cantilevers extending radially and linearly inward from the ring, such that the compressible insert is positioned to indirectly contact only the circumferential edge of the wafer disc via the separator disc and the compressible insert is free of direct contact with the wafer disc;
   securing a container cover to the container base to compress the cantilevers downward so as to stabilize the wafer disc by the circumferential edge while keeping a center portion of the wafer disc free of contact; and
   releasing the contain cover from the contain base to retrieve the wafer disc for manufacturing the integrated circuit on the wafer disc.

2. The method of claim 1, further comprising:
   selecting the compressible insert having a compressed height between a minimum container fill height and a maximum container fill height.

3. The method of claim 1, wherein:
   the placing the compressible insert includes placing a bottom ring of the ring in contact with the separator disc and positioning a top ring of the ring away from the center portion of the wafer disc, the bottom ring connecting a near end of each of the cantilevers and the top ring connecting a distal end of each of the cantilevers.

4. The method of claim 3, wherein:
   the securing the container cover to the container base includes compressing the cantilevers downward by contacting the top ring of the compressible insert.

5. The method of claim 1, wherein the cantilevers extend radially within 80% of a distance from the ring to a center defined by the ring.

6. The method of claim 1, wherein the compressible insert is compressible to a height between a minimum container fill height and a maximum container fill height.

7. The method of claim 1, the compressible insert includes a seam connecting the ring and the cantilever such that the secured container cover compresses the cantilevers to deform along the seam.

8. The method of claim 1, wherein the cantilevers extends radially inward and upward from the ring to form a partially convex surface, and the placing the compressible insert includes positioning the convex surface to point away from the wafer disc.

9. A method for packing an integrated circuit on a wafer disc, the method comprising:
   receiving the wafer disc into a container base;
   placing a compressible insert on the wafer disc, the compressible insert comprising a ring and radial members extending radially and linearly inward from the ring, such that the ring of the compressible insert contacts only a circumferential edge of the wafer disc without contacting a center portion of the wafer disc;
   securing a container cover to the container base to compress the radial members downward so as to stabilize the wafer disc by the circumferential edge while keeping the center portion of the wafer disc free of contact; and
   releasing the contain cover from the contain base to retrieve the wafer disc for manufacturing the integrated circuit on the wafer disc.

10. The method of claim 9, further comprising:
    selecting the compressible insert having a compressed height between a minimum container fill height and a maximum container fill height.

11. The method of claim 9, wherein:
    the placing the compressible insert includes placing a bottom ring of the ring in contact with the circumferential edge of the wafer disc and positioning a top ring of the ring away from the center portion of the wafer disc, the bottom ring connecting a near end of each of the radial members and the top ring connecting a distal end of each of the radial members.

12. The method of claim 11, wherein:
    the securing the container cover to the container base includes compressing the radial members downward by contacting the top ring of the compressible insert.

13. The method of claim 9, wherein the radial members extend radially within 80% of a distance from the ring to a center defined by the ring.

14. The method of claim 9, wherein the compressible insert is compressible to a height between a minimum container fill height and a maximum container fill height.

15. The method of claim 9, the compressible insert includes a seam connecting the ring and the radial members such that the secured container cover compresses the radial members to deform along the seam.

16. The method of claim 9, wherein the radial members extends radially inward and upward from the ring to form a partially convex surface, and the placing the compressible insert includes positioning the convex surface to point away from the wafer disc.

* * * * *